(12) United States Patent
Lee et al.

(10) Patent No.: US 11,024,568 B2
(45) Date of Patent: Jun. 1, 2021

(54) SEMICONDUCTOR PACKAGE

(71) Applicant: Samsung Electronics Co., Ltd., Suwon-si (KR)

(72) Inventors: Shle Ge Lee, Seoul (KR); Young Bae Kim, Seoul (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 98 days.

(21) Appl. No.: 16/391,494

(22) Filed: Apr. 23, 2019

(65) Prior Publication Data
US 2020/0043837 A1 Feb. 6, 2020

(30) Foreign Application Priority Data

Aug. 2, 2018 (KR) ........................ 10-2018-0090286

(51) Int. Cl.
*H01L 23/498* (2006.01)
*H01L 23/00* (2006.01)
*H01L 23/538* (2006.01)

(52) U.S. Cl.
CPC .. *H01L 23/49816* (2013.01); *H01L 23/49833* (2013.01); *H01L 23/5385* (2013.01); *H01L 24/17* (2013.01); *H01L 24/32* (2013.01)

(58) Field of Classification Search
CPC ............... H01L 23/49833; H01L 24/17; H01L 2225/1076; H01L 25/50; H01L 25/105; H01L 23/5384; H01L 23/562; H01L 24/73; H01L 24/92; H01L 2225/1023; H01L 2225/1058; H01L 2225/1041; H01L 2224/29078; H01L 2924/1436; H01L 2924/1437; H01L 2924/1441; H01L 2924/1443; H01L 2224/48227; H01L 2224/92225; H01L 24/13; H01L 24/16; H01L 24/29; H01L 2924/1433; H01L 2924/1431; H01L 2924/1432; H01L 2224/16227; H01L 2924/3511; H01L 2924/15311; H01L 2924/15331; H01L 2224/73253; H01L 2224/32225;
(Continued)

(56) References Cited

U.S. PATENT DOCUMENTS

9,048,168 B2 6/2015 Kwon et al.
9,064,971 B2 6/2015 Srinivasan et al.
9,087,780 B2 7/2015 Chen et al.
(Continued)

*Primary Examiner* — Karen Kusumakar
*Assistant Examiner* — Adam S Bowen
(74) *Attorney, Agent, or Firm* — Harness, Dickey & Pierce, P.L.C.

(57) ABSTRACT

A semiconductor package is provided. The semiconductor package includes a first substrate, a first semiconductor chip arranged on the first substrate, a first group of at least one solder ball arranged on a side surface of the first semiconductor chip, an interposer arranged on the first semiconductor chip and the first substrate and being in contact with the first group of at least one solder ball, and an adhesive layer arranged between the first semiconductor chip and the interposer and configured to expose at least a portion of un upper surface of the first semiconductor chip, wherein a first height from an upper surface of the first substrate to the upper surface of the first semiconductor chip is greater than a second height of the first group of at least one solder ball.

19 Claims, 10 Drawing Sheets

(58) Field of Classification Search
CPC ............. H01L 25/0652; H01L 23/3114; H01L 23/3128; H01L 23/488
See application file for complete search history.

(56) References Cited

U.S. PATENT DOCUMENTS

| | | |
|---|---|---|
| 9,437,554 B2 | 9/2016 | Ji et al. |
| 9,627,369 B2 | 4/2017 | Chen et al. |
| 9,953,934 B2 | 4/2018 | Kumar et al. |
| 2011/0233771 A1* | 9/2011 | Kwon ............... H01L 23/49838 257/737 |
| 2016/0039662 A1* | 2/2016 | Lin ................... H01L 23/49816 257/417 |
| 2017/0068633 A1 | 3/2017 | Kwon |
| 2017/0243799 A1 | 8/2017 | Kim et al. |
| 2018/0087185 A1 | 3/2018 | Yoshida |

\* cited by examiner

SEMICONDUCTOR PACKAGE

This application claims priority to Korean Patent Application No. 10-2018-0090286, filed on Aug. 2, 2018, and all the benefits accruing therefrom under 35 U.S.C. § 119, the disclosure of which is incorporated herein by reference in its entirety.

BACKGROUND

1. Technical Field

The present disclosure relates to a semiconductor package.

2. Description of the Related Art

Needs in higher performance, faster speed operation, and/or miniaturization of electronic elements are increasing with development of the electronic industry. In response to the above trend, a method for stacking and populating several semiconductor chips on one package substrate or a method for staking another package on a package may be used. For example, a package-in-package (PIP) type of a semiconductor package or a package-on-package (POP) type of a semiconductor package may be used.

SUMMARY

Some example embodiments provide a POP type of a semiconductor package that may include an interposer for electrical connection between an upper package and a lower package. The interposer may facilitate connection between an upper package and a lower package and reduce or prevent warpage of an upper package and a lower package.

Some example embodiments provide a semiconductor package enhanced with reliability by using restitution force of an interposer for reducing or preventing warpage.

According to some example embodiments, there is provided a semiconductor package, comprising a first substrate, a first semiconductor chip on the first substrate, a first group of at least one solder ball on a side surface of the first semiconductor chip, an interposer on the first semiconductor chip and the first substrate and being in contact with the first group of at least one solder ball, and an adhesive layer between the first semiconductor chip and the interposer and configured to expose at least a portion of un upper surface of the first semiconductor chip, wherein a first height from an upper surface of the first substrate to the upper surface of the first semiconductor chip is greater than a second height of the first group of at least one solder ball.

According to some example embodiments, there is provided a semiconductor package, comprising a first package comprising a first substrate and a first semiconductor chip on the first substrate and convex in a direction in which the first substrate is positioned, a second package on the first package and comprising a second substrate and a second semiconductor chip on the second substrate, an interposer between the first package and the second package, and a first group of at least one solder ball on a side surface of the first semiconductor chip and configured to electrically connect the first substrate and the interposer, wherein a first height from an upper surface of the first substrate to an upper surface of the first semiconductor chip is greater than a second height of the first group of at least one solder ball.

According to some example embodiments, there is provided a semiconductor package, comprising a first substrate convex in a direction in which a lower surface is positioned, a first semiconductor chip on an upper surface of the first substrate and comprising an upper surface having a first width, an interposer on an upper surface of the first semiconductor chip and having a height from the upper surface of the first substrate becoming smaller farther away from a center of the first substrate, an adhesive layer between the first semiconductor chip and the interposer and comprising a lower surface having a second width smaller than the first width of the upper surface of the first semiconductor chip, and a molding layer at least partially around a side surface of the adhesive layer and the first semiconductor chip between the first substrate and the interposer.

The objectives that are intended to be addressed by the present disclosure are not limited to those mentioned above, and other objectives that are not mentioned above may be clearly understood to those skilled in the art based on the description provided below.

BRIEF DESCRIPTION OF THE DRAWINGS

The above and other objects, features and advantages of the present disclosure will become more apparent to those of ordinary skill in the art by describing in detail example embodiments thereof with reference to the accompanying drawings, in which.

DETAILED DESCRIPTION

In this specification, a POP type of a semiconductor package will be described below; however, the present disclosure is not limited thereto.

Hereinbelow, a semiconductor package according to some example embodiments will be described with reference to FIG. 1.

Figure 1:
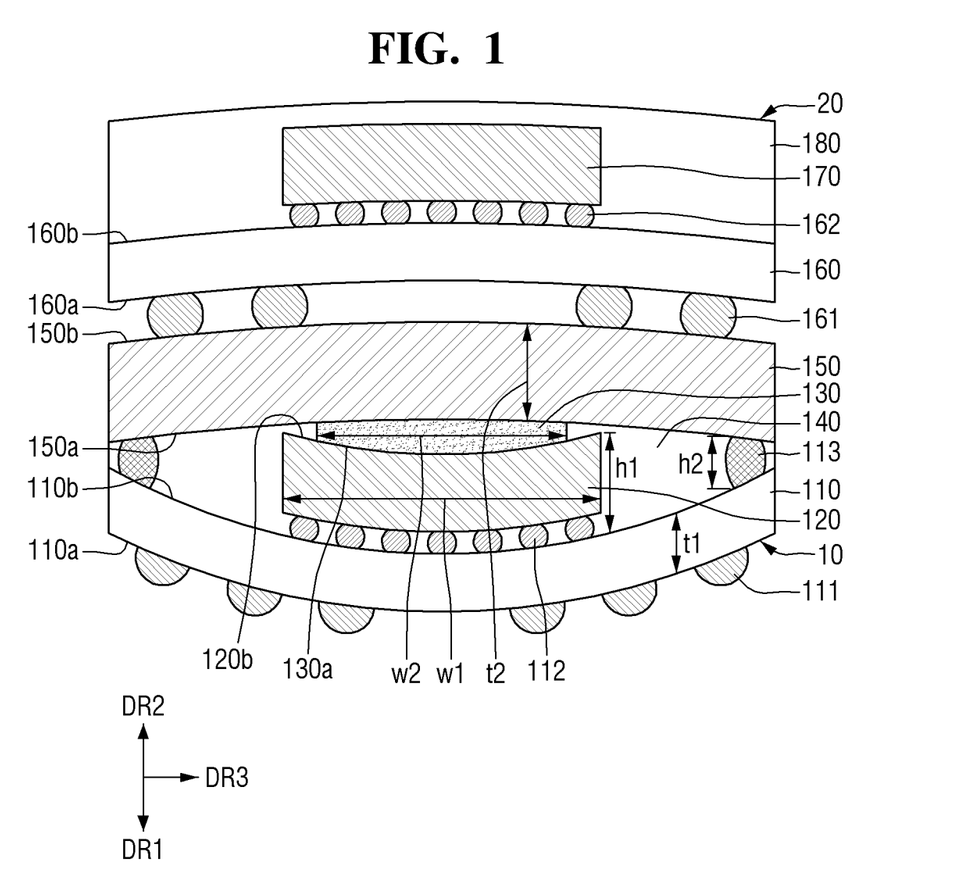
FIG. 1 is a view provided to explain a semiconductor package according to some example embodiments.

FIG. 1 is a view provided to explain a semiconductor package according to some example embodiments.

Referring to FIG. 1, the semiconductor package according to some example embodiments includes a first package 10, an interposer 150, and/or a second package 20.

The first package 10 may include a first substrate 110, a first group of at least one solder ball 111, a second group of at least one solder ball 112, a third group of at least one solder ball 113, a first semiconductor chip 120, an adhesive layer 130, and/or a first molding layer 140.

The first substrate 110 may be, for example, a printed circuit board (PCB) or a ceramic substrate. However, the present disclosure is not limited thereto.

When the first substrate 110 is a PCB, the first substrate 110 may be comprised with at least one material selected from phenol resin, epoxy resin, and polyimide. For example, the first substrate 110 may include at least one material selected from FR4, tetrafunctional epoxy, polyphenylene ether, epoxy/polyphenylene oxide, bismaleimide triazine BT, thermount, cyanate ester, polyimide, and liquid crystal polymer. A surface of the first substrate 110 may be covered by solder-resist, although the present disclosure is not limited thereto.

The first substrate 110 may include a lower surface 110a and an upper surface 110b opposing to each other. The first substrate 110 may be formed to be convex in a first direction DR1 in which the lower surface 110a of the first substrate 110 is positioned. The first substrate 110 may have a first thickness t1 in DR1.

The first group of at least one solder ball 111 may be positioned on the lower surface 110a of the first substrate 110. The first group of at least one solder ball 111 may be in contact with a conductive socket arranged on the lower surface 110a of the first substrate 110. The first group of at least one solder ball 111 may protrude in convex from the lower surface 110a of the first substrate 110 in DR1. The first group of at least one solder ball 111 may be a part for electrical connection of the first substrate 110 with another external element.

The first group of at least one solder ball 111 may include, for example, at least one of tin Sn, lead Pb, nickel Ni, gold Au, silver Ag, copper Cu, bismuth Bi, and combination of the above, but the present disclosure is not limited thereto.

The first semiconductor chip 120 may be arranged on the upper surface 110b of the first substrate 110. The first semiconductor chip 120 may be a logic semiconductor chip, operating as micro-processor. The first semiconductor chip 120 may be, for example, a central processing unit (CPU), a controller or an application specific integrated circuit (ASIC).

The first semiconductor chip 120 may be formed to be convex in DR1. The first semiconductor chip 120 may be arranged to be parallel with the first substrate 110. However, the present disclosure is not limited thereto. That is, according to some other example embodiments, the first semiconductor chip 120 may be arranged to be flat without having a curvature.

Although it is illustrated in FIG. 1 that only one semiconductor chip is formed on the first substrate 110, the present disclosure is not limited thereto. That is, according to some other example embodiments, a plurality of semiconductor chips may be stacked on the first substrate 110.

The second group of at least one solder ball 112 may be arranged on the upper surface 110b of the first substrate 110. For example, the second group of at least one solder ball 112 may be arranged between the upper surface 110b of the first substrate 110 and the first semiconductor chip 120.

The second group of at least one solder ball 112 may be in contact with a conductive socket arranged on the upper surface 110b of the first substrate 110. Further, the second group of at least one solder ball 112 may be in contact with a conductive socket arranged on a lower surface of the first semiconductor chip 120. The second group of at least one solder ball 112 may electrically connect the first substrate 110 and the first semiconductor chip 120.

The second group of at least one solder ball 112 may include, for example, tin Sn, indium In, bismuth Bi, antimony Sb, copper Cu, silver Ag, zinc Zn, lead Pb and combination of the above, but the present disclosure is not limited thereto.

The third group of at least one solder ball 113 may be arranged on a side surface of the first semiconductor chip 120. For example, the third group of at least one solder ball 113 may be arranged between the upper surface 110b of the first substrate 110 and a lower surface 150a of the interposer 150 so as to be displaced from a side surface of the first semiconductor chip 120 (e.g., to be displaced in a third direction DR3).

The third group of at least one solder ball 113 may be in contact with a conductive socket arranged on the upper surface 110b of the first substrate 110. Further, the third group of at least one solder ball 113 may be in contact with a conductive socket arranged on the lower surface 150a of the interposer 150. The third group of at least one solder ball 113 may electrically connect the first substrate 110 and the interposer 150.

A first height h1 from the upper surface 110b of the first substrate 110 to an upper surface 120b of the first semiconductor chip 120 may be formed to be greater than a second height h2 of the third group of at least one solder ball 113.

The above is related with convex formation of the interposer 150 in a second direction DR2 by applying pressure to an edge of the interposer 150 during a stacking process of the interposer 150 on the first package 10. This will be described in greater detail below.

The third group of at least one solder ball 113 may include, for example, tin Sn, indium In, bismuth Bi, antimony Sb, copper Cu, silver Ag, zinc Zn, lead Pb, and combination of the above, but the present disclosure is not limited thereto.

The adhesive layer 130 may be arranged between the upper surface 120b of the first semiconductor chip 120 and the lower surface 150a of the interposer 150.

The adhesive layer 130 may expose at least a portion of the upper surface 120b of the first semiconductor chip 120. For example, the adhesive layer 130 may be arranged on the upper surface 120b of the first semiconductor chip 120 so that the upper surface 120b of the first semiconductor chip 120 is exposed in an edge portion. A first width W1 of the upper surface 120b of the first semiconductor chip 120 may be formed to be greater than a second width W2 of the lower surface 130a of the adhesive layer 130.

The adhesive layer 130 may perform a function of bonding the interposer 150 on the first semiconductor chip 120. The adhesive layer 130 may include, for example, at least one organic resin of epoxy resin, acrylic resin, polyester resin or polycarbonate, but the present disclosure is not limited thereto.

The first molding layer 140 may be arranged between the upper surface 110b of the first substrate 110 and the lower surface 150a of the interposer 150.

For example, the first molding layer 140 may be arranged to cover the upper surface 110b of the first substrate 110, a side surface of the second group of at least one solder ball 112, a side surface of the third group of at least one solder ball 113, the first semiconductor chip 120, a side surface of the adhesive layer 130, and/or the lower surface 150a of the interposer 150 on the first substrate 110.

That is, the first molding layer 140 may be arranged on the upper surface 120b of the first semiconductor chip 120 exposed in a side surface of the adhesive layer 130.

The first molding layer 140 may be formed of, for example, silicon based material, thermosetting material, thermoplastic material, UV processed material, and so on. Further, the first molding layer 140 may be formed of polymer such as resin, for example, epoxy molding compound (EMC).

The interposer 150 may be arranged on the first package 10. For example, the interposer 150 may be arranged on the first semiconductor chip 120 and the first substrate 110, and may be bonded on the first semiconductor chip 120 through the adhesive layer 130. The interposer 150 may be displaced from the first semiconductor chip 120 and arranged.

The lower surface 150a of the interposer 150 may be in contact with the third group of at least one solder ball 113. The interposer 150 may be electrically connected with the first substrate 110 through the third group of at least one solder ball 113.

The interposer 150 may be formed to be convex in DR2 in which the upper surface 150b of the interposer 150 is positioned. However, the present disclosure is not limited thereto. That is, according to some other example embodiments, the interposer 150 may be formed to be convex in DR1 along with initial form and restitution force of the interposer 150 during a fabrication process.

The interposer 150 may be formed so that a height from the upper surface 110b of the first substrate 110 to the lower surface 150a of the interposer 150 becomes smaller farther away from a center of the first substrate 110.

The interposer 150 may have a second thickness t2 in DR1. The second thickness t2 of the interposer 150 may be formed to be greater than the first thickness t1 of the first substrate 110. As the second thickness t2 of the interposer 150 is formed to be greater than the first thickness t1 of the first substrate 110, restitution force of the interposer 150 may be mounted up, and accordingly, warpage of the semiconductor package may be reduced or prevented.

The interposer 150 may include at least one of silicon, glass, ceramic or plastic. However, the present disclosure is not limited thereto.

The second package 20 may be arranged on the upper surface 150b of the interposer 150. The second package 20 may be formed to be convex in DR2. However, the present disclosure is not limited thereto.

The second package 20 may include a second substrate 160, a fourth group of at least one solder ball 161, a fifth group of at least one solder ball 162, a second semiconductor chip 170, and/or a second molding layer 180.

The second substrate 160 may be arranged to be parallel with the interposer 150 on the upper surface 150b of the interposer 150. The second substrate 160 may be, for example, a printed circuit board (PCB) or a ceramic substrate. However, the present disclosure is not limited thereto.

A surface of the second substrate 160 may be covered by solder-resist, although the present disclosure is not limited thereto.

The second substrate 160 may include a lower surface 160a facing the upper surface 150b of the interposer 150 and an upper surface 160b opposing the lower surface 160a. The second substrate 160 may be formed to be convex in DR2.

The fourth solder ball 161 may be arranged on the lower surface 160a of the second substrate 160. For example, the fourth solder ball 161 may be arranged between the lower surface 160a of the second substrate 160 and the upper surface 150b of the interposer 150.

The fourth group of at least one solder ball 161 may be in contact with a conductive socket arranged on the lower surface 160a of the second substrate 160. Further, the fourth group of at least one solder ball 161 may be in contact with a conductive socket arranged on the upper surface 150b of the interposer 150. The fourth group of at least one solder ball 161 may electrically connect the second substrate 160 and the interposer 150.

The fourth group of at least one solder ball 161 may include, for example, at least one of tin Sn, lead Pb, nickel Ni, gold Au, silver Ag, copper Cu, bismuth Bi, and combination of the above, but the present disclosure is not limited thereto.

The second semiconductor chip 170 may be arranged on the upper surface 160b of the second substrate 160. The second semiconductor chip 170 may be, for example, a semiconductor memory chip. The second semiconductor chip 170 may be, for example, a volatile memory semiconductor chip such as dynamic random access memory (DRAM) or static random access memory (SRAM) or a nonvolatile memory semiconductor chip such as phase-change random access memory (PRAM), magnetoresistive random access memory (MRAM), ferroelectric random access memory (FeRAM), or resistive random access memory (RRAM). However, the present disclosure is not limited thereto.

The second semiconductor chip 170 may be formed to be convex in DR2. The second semiconductor chip 170 may be arranged to be parallel with the second substrate 160. However, the present disclosure is not limited thereto. That is, according to some other example embodiments, the second semiconductor chip 170 may be arranged to be flat without having a curvature.

Although it is illustrated in FIG. 1 that only one semiconductor chip is formed on the second substrate 160, the present disclosure is not limited thereto. That is, according to some other example embodiments, a plurality of semiconductor chips may be stacked on the second substrate 160.

The fifth group of at least one solder ball 162 may be arranged on the upper surface 160b of the second substrate 160. For example, the fifth group of at least one solder ball 162 may be arranged between the upper surface 160b of the second substrate 160 and the second semiconductor chip 170.

The fifth group of at least one solder ball 162 may be in contact with a conductive socket arranged on the upper surface 160b of the second substrate 160. Further, the fifth group of at least one solder ball 162 may be in contact with a conductive socket arranged on the lower surface of the second semiconductor chip 170. The fifth group of at least one solder ball 162 may electrically connect the second substrate 160 and the second semiconductor chip 170.

The fifth group of at least one solder ball 162 may include, for example, tin Sn, indium In, bismuth Bi, antimony Sb, copper Cu, silver Ag, zinc Zn, lead Pb, and combination of the above, but the present disclosure is not limited thereto.

Although it is illustrated in FIG. 1 that the second semiconductor chip 170 is electrically connected with the second substrate 160 through the fifth group of at least one solder ball 162, the present disclosure is not limited thereto. That is, according to some other example embodiments, the second semiconductor chip 170 may be electrically connected with the second substrate 160 through a bonding wire.

The second molding layer 180 may be arranged on the upper surface 160b of the second substrate 160. For example, the second molding layer 180 may be arranged to cover the upper surface 160b of the second substrate 160, a side surface of the fifth group of at least one solder ball 162 and the second semiconductor chip 170 on the second substrate 160.

The second molding layer 180 may be formed with, for example, silicon based material, thermosetting material, thermoplastic material, UV processed material and so on. Further, the second molding layer 180 may be formed with polymer such as resin, for example, epoxy molding compound (EMC).

The semiconductor package according to some example embodiments may enhance reliability of the semiconductor package by reducing or preventing warpage of the semiconductor package using the restitution force of the interposer 150.

For example, the semiconductor package according to some example embodiments may fix the interposer 150 with the first semiconductor chip 120 by using the adhesive layer 130 and modify the first package 10 arranged on a lower portion of the interposer 150 into smile form (downwardly convex form) through restitution force, which resulting in reducing or preventing warpage in the semiconductor package.

For the above effects, a second width W2 of the adhesive layer 130 may be formed to be smaller than a first width W1 of the first semiconductor chip 120. Further, a height between the first substrate 110 and the interposer 150 may be formed to be smaller farther away from a center of the first substrate 110. That is, a first height h1 from the upper surface 110b of the first substrate 110 to the upper surface 120b of the first semiconductor chip 120 may be formed to be greater than a second height h2 of the third group of at least one solder ball 113.

Hereinbelow, a method for fabricating a semiconductor package according to some example embodiments will be described with reference to FIG. 1 to FIG. 6.

FIG. 2 to FIG. 6 are views illustrating intermediate stages of fabrication, provided to explain a method for fabricating a semiconductor package according to some example embodiments.

Figure 2:
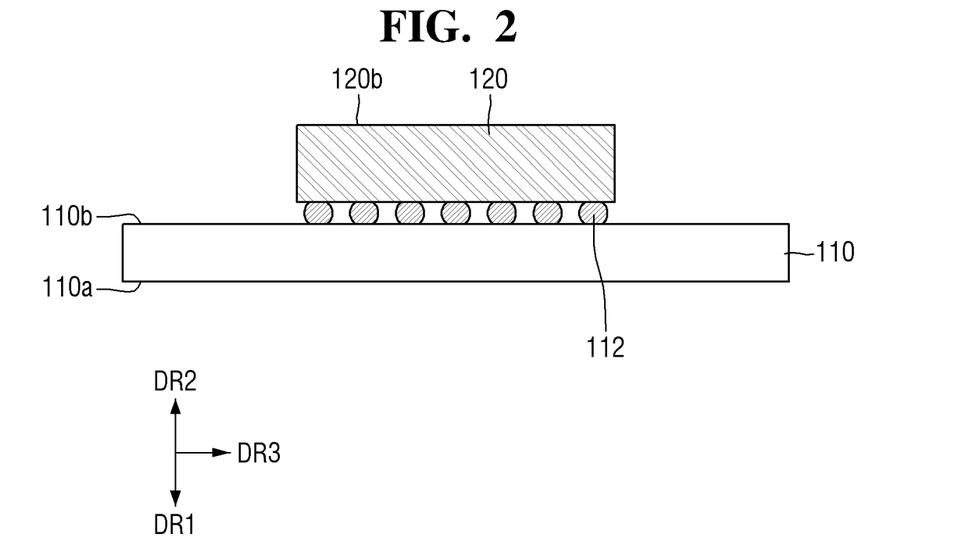
FIG. 2 to FIG. 6 are views illustrating intermediate stages of fabrication, provided to explain a method for fabricating a semiconductor package according to some example embodiments.

Referring to FIG. 2, the first semiconductor chip 120 formed with the second group of at least one solder ball 112 may be formed on the upper surface 110b of the first substrate 110.

Figure 3:
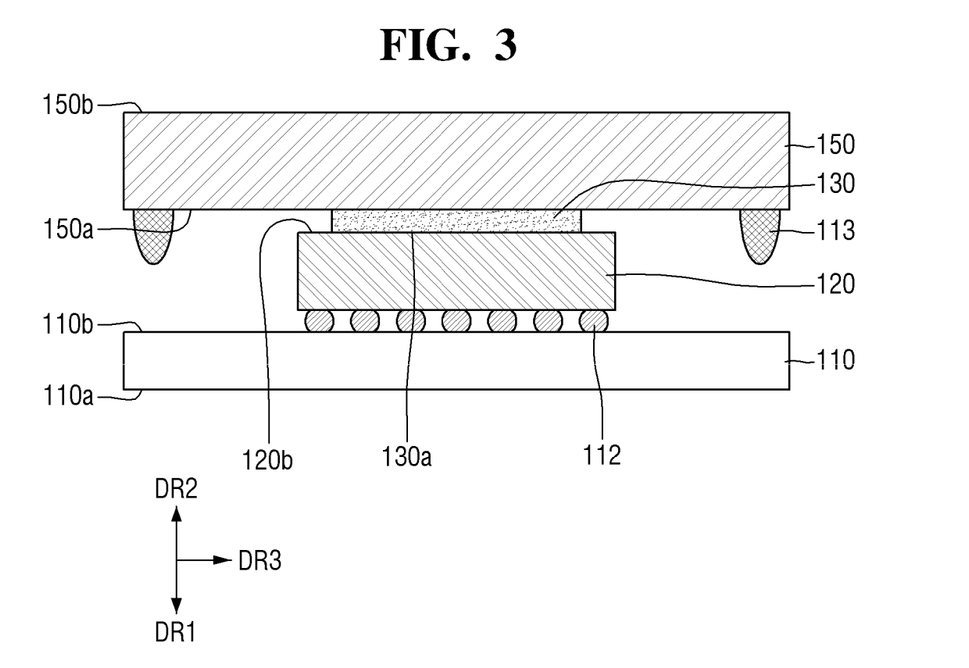

Referring to FIG. 3, the adhesive layer 130 may be formed on the upper surface 120b of the first semiconductor chip 120. The adhesive layer 130 may be formed to expose an edge of the upper surface 120b of the first semiconductor chip 120.

Next, the interposer 150 may be bonded to the adhesive layer 130.

In some example embodiments, the third group of at least one solder ball 113 may be formed on the lower surface 150a of the interposer 150. For example, the third group of at least one solder ball 113 may be formed to be protruded in DR1 on an edge of the lower surface 150a of the interposer 150 which does not overlap with the first semiconductor chip 120.

However, the present disclosure is not limited thereto. That is, according to some other example embodiments, the third group of at least one solder ball 113 may be formed to protrude in DR2 on an edge of the upper surface 110b of the first substrate 110 which does not overlap with the first semiconductor chip 120.

Figure 4:
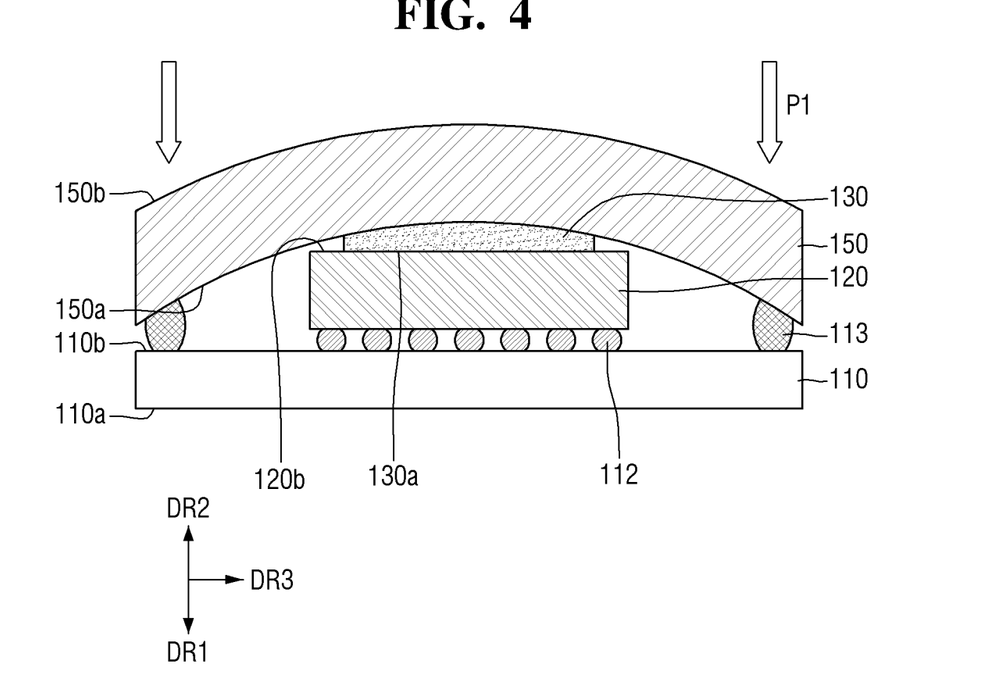

Referring to FIG. 4, the third group of at least one solder ball 113 may be connected with the first substrate 110 by performing compression process P1 in DR1 on an edge of the lower surface 150a of the interposer 150 which does not overlap with the first semiconductor chip 120.

The interposer 150 may be formed to be convex in DR2 through the compression process P1.

Figure 5:
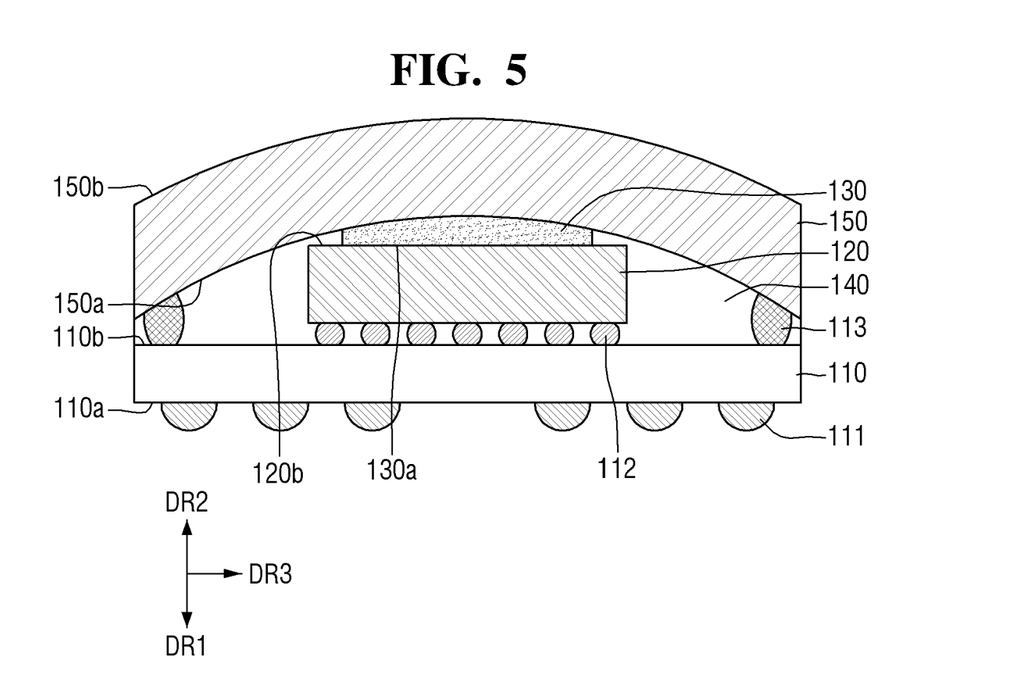

Referring to FIG. 5, the first molding layer 140 may be formed between the upper surface 110b of the first substrate 110 and the lower surface 150a of the interposer 150.

For example, the first molding layer 140 may be formed to cover the upper surface 110b of the first substrate 110, a side surface of the second group of at least one solder ball 112, a side surface of the third group of at least one solder ball 113, the first semiconductor chip 120, a side surface of the adhesive layer 130 and the lower surface 150a of the interposer 150.

Next, the first group of at least one solder ball 111 may be formed on the lower surface 110a of the first substrate 110. The first group of at least one solder ball 111 may be formed to be protruded in convex from the lower surface 110a of the first substrate 110 in DR1.

Figure 6:
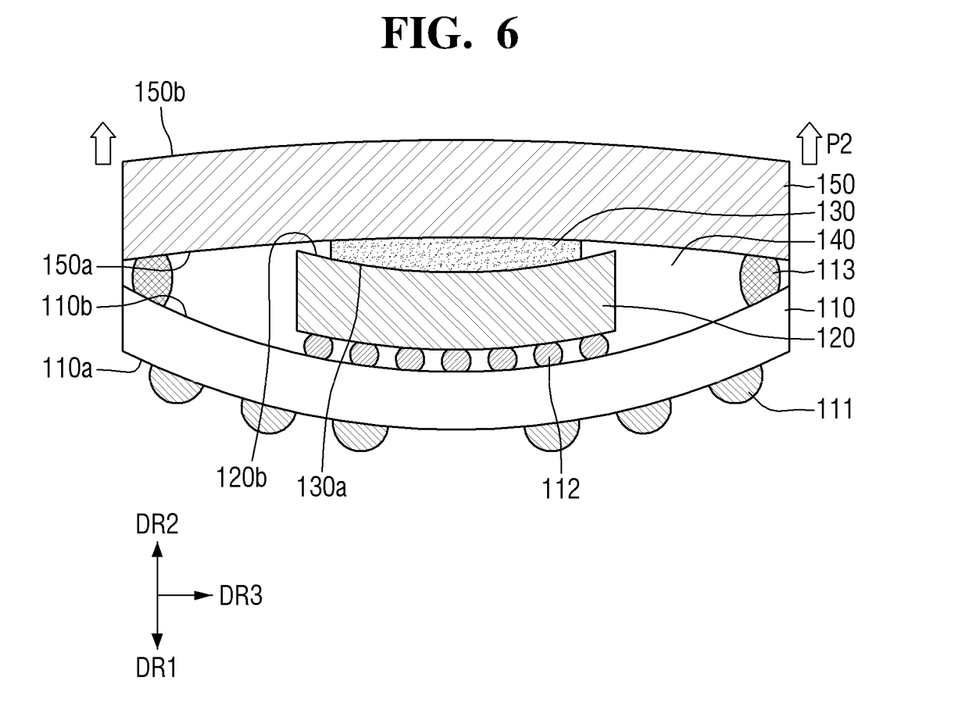

Referring to FIG. 6, an edge of the interposer 150 and an edge of the first substrate 110 may be moved in DR2 with restitution force P2 because of strength of the interposer 150. In some example embodiments, the adhesive layer 130 formed on the first semiconductor chip 120 may support a center of the interposer 150.

With restitution force P2 of the interposer 150, the first substrate 110 may have a convex shape in DR1. The interposer 150 may have a convex shape in DR2.

In some example embodiments, the first semiconductor chip 120 may be formed to be convex in DR1. However, the present disclosure is not limited thereto. That is, according to some other example embodiments, the first semiconductor chip 120 may be formed to be flat without having a curvature.

Although it is illustrated in FIG. 6 that convex degree of the first substrate 110 is greater than that of the interposer 150, the present disclosure is not limited thereto. That is, according to some other example embodiments, convex degree of the interposer 150 may be formed to be greater than that of the first substrate 110 along with strength of restitution force P2 of the interposer 150.

Referring to FIG. 1, a second package 20 may be formed on the upper surface 150b of the interposer 150.

For example, the second package 20 including the second substrate 160, the second semiconductor chip 170 formed on the second substrate 160, and the second molding layer 180 formed to cover the second substrate 160 and the second semiconductor chip 170 may be formed on the upper surface 150b of the interposer 150.

In some example embodiments, the lower surface 160a of the second substrate 160 may be connected with the upper surface 150b of the interposer 150 through the fourth group of at least one solder ball 161.

Although it is illustrated in FIG. 1 that the second semiconductor chip 170 is electrically connected with the second substrate 160 through the fifth group of at least one solder ball 162, the present disclosure is not limited thereto. That is, according to some other example embodiments, the second semiconductor chip 170 may be electrically connected with the second substrate 160 through a bonding wire.

Although not illustrated in FIG. 1, a molding layer or an insulating layer may be additionally formed so as to at least partially wrap around a side surface of the fourth group of at least one solder ball 161 between the lower surface 160a of the second substrate 160 and the upper surface 150b of the interposer 150.

A semiconductor package according to some example embodiments may be fabricated through the above-described fabrication method.

Hereinbelow, a semiconductor package according to some other example embodiments will be described with reference to FIG. 7. The description will be made with the main focus on the differences from the semiconductor package illustrated in FIG. 1.

Figure 7:
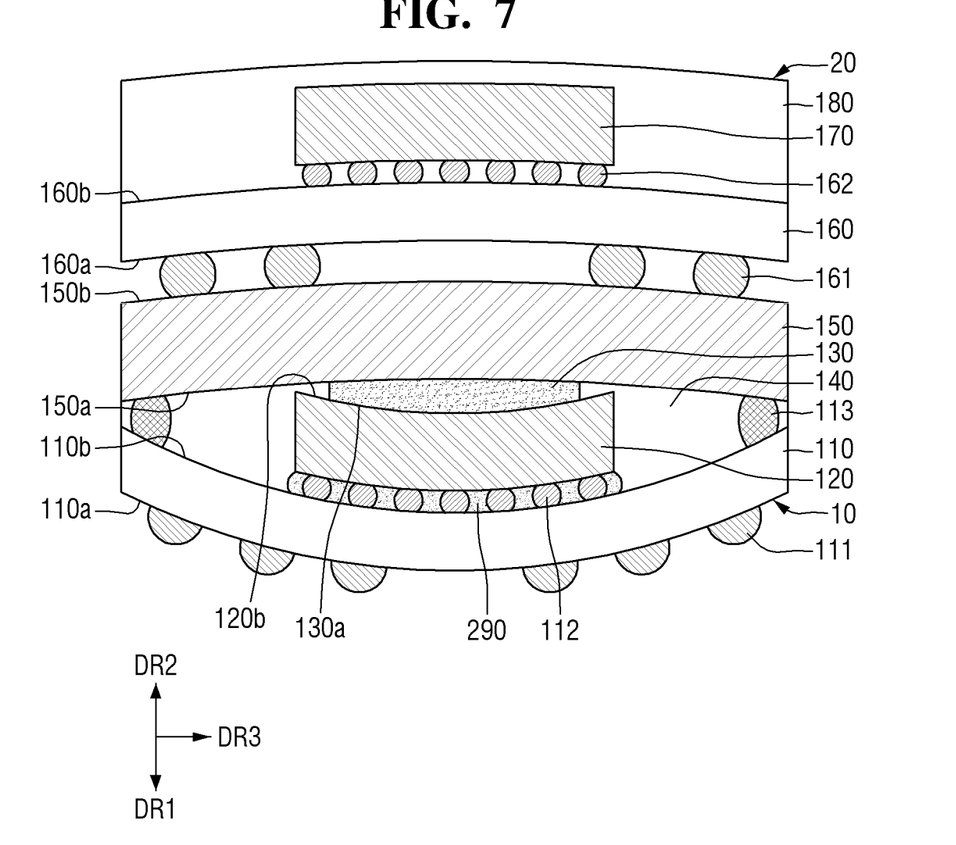
FIG. 7 is a view provided to explain a semiconductor package according to some other example embodiments.

FIG. 7 is a view provided to explain a semiconductor package according to some other example embodiments.

Referring to FIG. 7, an underfill material 290 may be formed to at least partially wrap around a side surface of the second group of at least one solder ball 112 between the first substrate 110 and the first semiconductor chip 120. The first molding layer 140 may be formed to at least partially wrap around a side surface of the underfill material 290 without being in direct contact with the second group of at least one solder ball 112.

The underfill material 290 may be formed to further protrude in a side direction from a side surface of the first semiconductor chip 120, but the present disclosure is not limited thereto.

Although not illustrated in FIG. 7, according to some other example embodiments, the underfill material may be formed so as to at least partially wrap around a side surface of the fifth group of at least one solder ball 162 between the second substrate 160 and the second semiconductor chip 170.

Hereinbelow, a semiconductor package according to some other example embodiments will be described with reference to FIG. 8. The description will be made with the main focus on the differences from the semiconductor package illustrated in FIG. 1.

Figure 8:
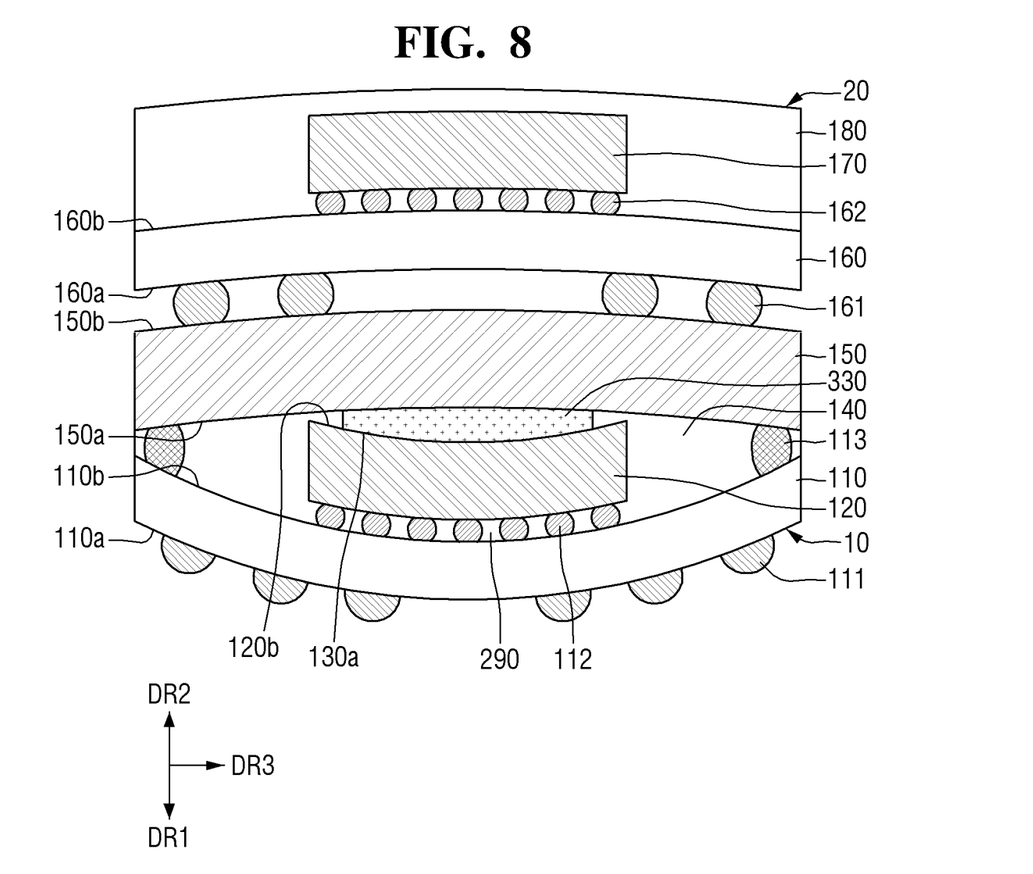
FIG. 8 is a view provided to explain a semiconductor package according to some other example embodiments.

FIG. 8 is a view provided to explain a semiconductor package according to some other example embodiments.

Referring to FIG. 8, an insulating layer 330 may be arranged between the upper surface 120b of the first semiconductor chip 120 and the lower surface 150a of the interposer 150.

Likewise in the adhesive layer 130 illustrated in FIG. 1, the insulating layer 330 may be arranged on the upper surface 120b of the first semiconductor chip 120 so as to expose an edge of the upper surface 120b of the first semiconductor chip 120. The first molding layer 140 may be at least partially around a side surface of the insulating layer 330.

The insulating layer 330 may include, for example, at least one of silicon oxide, silicon nitride, silicon oxynitride, and low-k dielectric material.

For example, the low-k dielectric material may include flowable oxide (FOX), tonen silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or combination of the above, but not limited thereto.

Hereinbelow, a semiconductor package according to some other example embodiments will be described with reference to FIG. 9. The description will be made with the main focus on the differences from the semiconductor package illustrated in FIG. 1.

Figure 9:
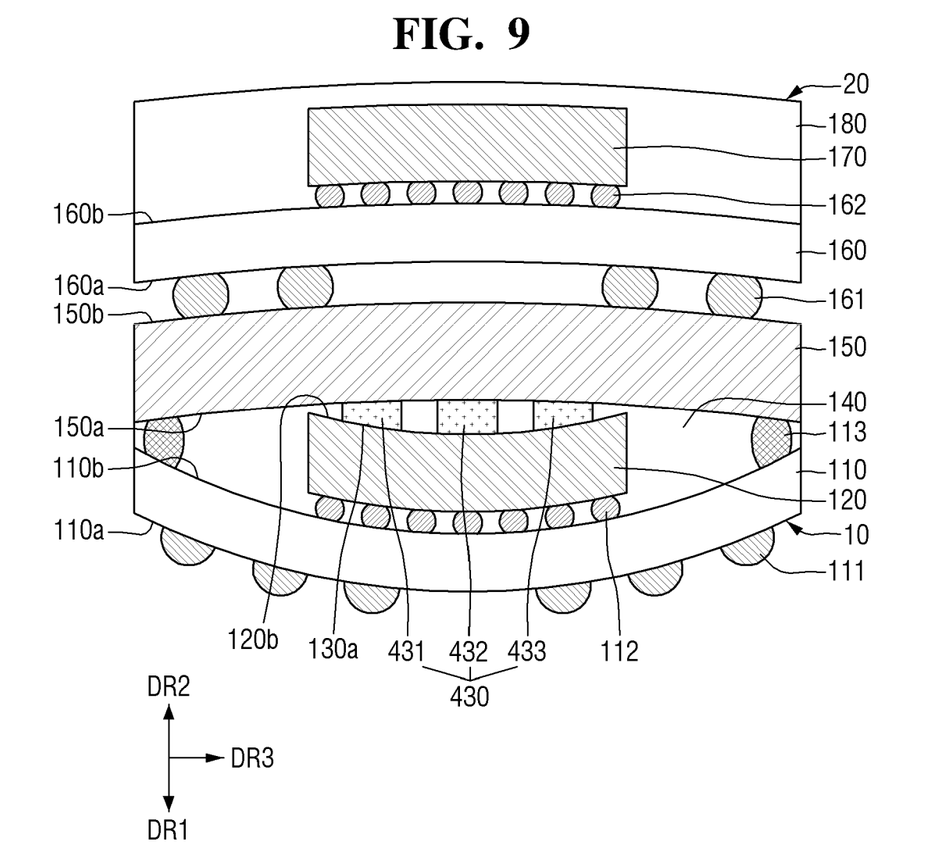
FIG. 9 is a view provided to explain a semiconductor package according to some other example embodiments.

FIG. 9 is a view provided to explain a semiconductor package according to some other example embodiments.

Referring to FIG. 9, the insulating layer 430 may be arranged between the upper surface 120b of the first semiconductor chip 120 and the lower surface 150a of the interposer 150. The insulating layer 430 may expose at least a portion of the upper surface 120b of the first semiconductor chip 120.

The insulating layer 430 may include a first sub insulating layer 431, a second sub insulating layer 432, and/or a third sub insulating layer 433 which are displaced from each other in DR3. However, the present disclosure is not limited thereto. That is, according to some other example embodiments, the insulating layer 430 may include two sub insulating layers which are displaced from each other in DR3 or four or more sub insulating layers which are displaced from each other in DR3.

The first molding layer 140 may be at least partially around side surfaces of the first sub insulating layer 431, the second sub insulating layer 432, and the third sub insulating layer 433, respectively. That is, the first molding layer 140 may be arranged between the first sub insulating layer 431 and the second sub insulating layer 432 and between the second sub insulating layer 432 and the third sub insulating layer 433.

The insulating layer 430 may include, for example, at least one of silicon oxide, silicon nitride, silicon oxynitride, and low-k dielectric material.

Hereinbelow, a semiconductor package according to some other example embodiments will be described with reference to FIG. 10. The description will be made with the main focus on the differences from the semiconductor package illustrated in FIG. 1.

Figure 10:
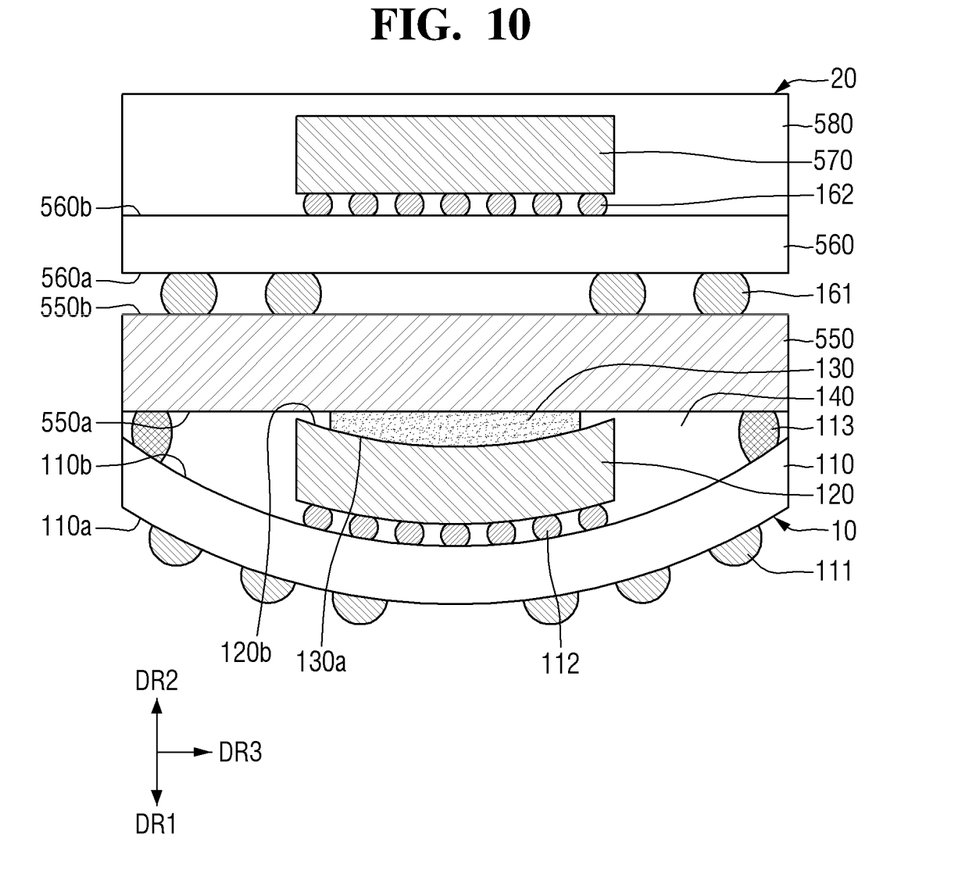
FIG. 10 is a view provided to explain a semiconductor package according to some other example embodiments.

FIG. 10 is a view provided to explain a semiconductor package according to some other example embodiments.

Referring to FIG. 10, the interposer 550 and the second package 20 may be sequentially stacked to be flat on the first package 10 without having a curvature.

For example, the interposer 550 may be arranged to extend in DR3 on the first package 10 without having a curvature. That is, the lower surface 550a and the upper surface 550b of the interposer 550 may be formed to extend in DR3.

The second substrate 560 may be formed so that the lower surface 560a and the upper surface 560b of the second substrate 560 extend in DR3 to be parallel with the interposer 550. The second semiconductor chip 570 and the second molding layer 580 covering the second semiconductor chip 570 may be formed on the second substrate 560.

Hereinbelow, a semiconductor package according to some other example embodiments will be described with reference to FIG. 11. The description will be made with the main focus on the differences from the semiconductor package illustrated in FIG. 1.

Figure 11:
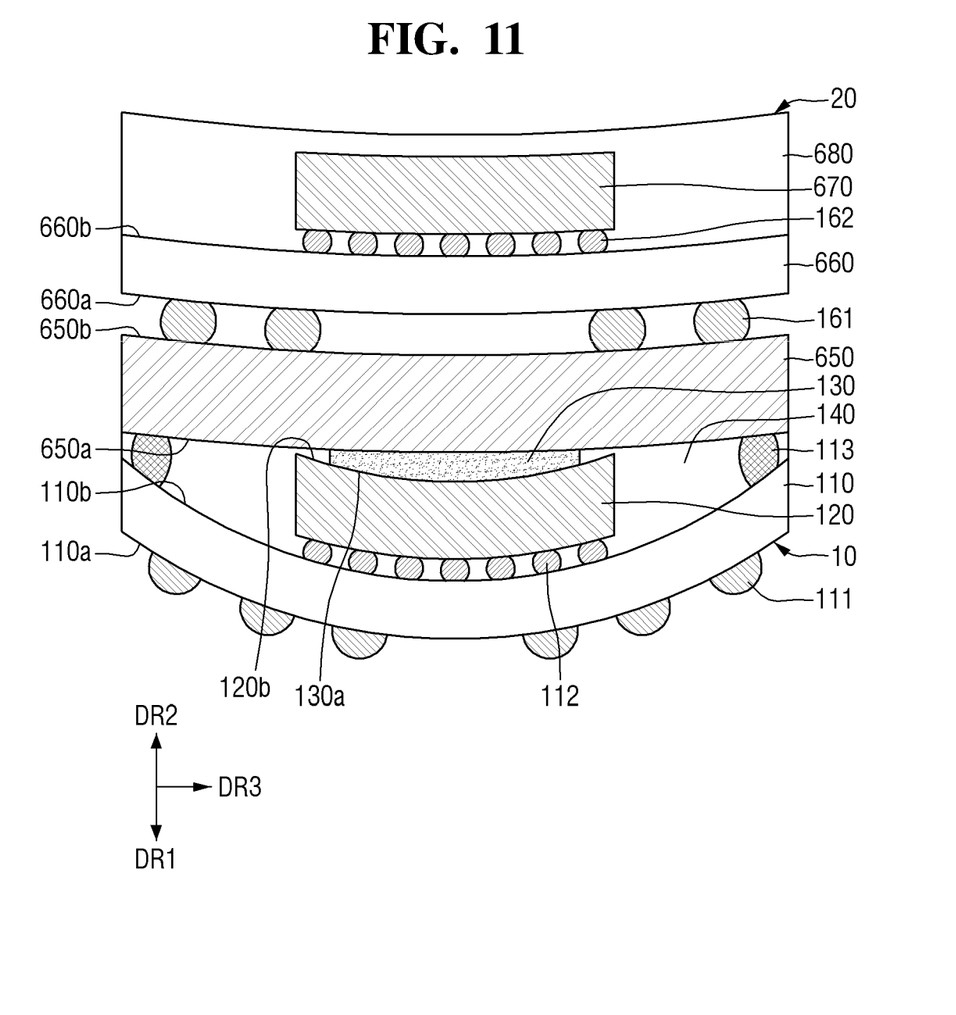
FIG. 11 is a view provided to explain a semiconductor package according to some other example embodiments.

FIG. 11 is a view provided to explain a semiconductor package according to some other example embodiments.

Referring to FIG. 11, the interposer 650 and the second package 20 may be sequentially stacked to be convex in DR1 on the first package 10.

For example, the interposer 650 and the second substrate 660 may be sequentially stacked to be convex in DR1, and the second semiconductor chip 670 and the second molding layer 680 covering the second semiconductor chip 670 may be formed on the second substrate 660.

Convex degree of the interposer 650 may be smaller than that of the first substrate 110. Further, convex degree of the second package 20 may be smaller than that of the first substrate 110.

In some example embodiments, convex degree of the interposer 650 may be same as that of the second package 20. That is, each of the lower surface 650a of the interposer 650, the upper surface 650b of the interposer 650, the lower surface 660a of the second substrate 660 and the upper surface 660b of the second substrate 660 may be formed to be parallel.

Example embodiments according to the present disclosure were explained hereinabove with reference to drawings attached, but it should be understood that the present disclosure is not limited to the aforementioned example embodiments, but may be in various different forms, and may be implemented by a person skilled in the art in other specific forms without altering the technical concept or essential characteristics of the present disclosure. Accordingly, it will be understood that the example embodiments described above are only illustrative, and should not be construed as limiting.

What is claimed is:

1. A semiconductor package, comprising:
a first substrate;
a first semiconductor chip on the first substrate;
a first group of at least one solder ball on a side surface of the first semiconductor chip;
an interposer on the first semiconductor chip and the first substrate and in contact with the first group of at least one solder ball; and
an adhesive layer between the first semiconductor chip and the interposer and configured to expose at least a portion of an upper surface of the first semiconductor chip,
wherein a first height from an upper surface of the first substrate to the upper surface of the first semiconductor chip is greater than a second height of the first group of at least one solder ball, the second height being a height of an innermost side of the first group of at least solder ball.

2. The semiconductor package of claim 1, wherein the first substrate is convex in a direction in which a lower surface of the first substrate is positioned, and
the interposer is convex in a direction in which an upper surface of the interposer is positioned.

3. The semiconductor package of claim 1, wherein the first substrate is convex in a direction in which a lower surface of the first substrate is positioned, and
the interposer is convex in a direction in which a lower surface of the interposer is positioned.

4. The semiconductor package of claim 1, wherein a first width of the upper surface of the first semiconductor chip is greater than a second width of a lower surface of the adhesive layer.

5. The semiconductor package of claim 1, wherein a height of the interposer from the upper surface of the first substrate becomes smaller farther away from a center of the first substrate.

6. The semiconductor package of claim 1, further comprising:
a second substrate on an upper surface of the interposer; and
a second semiconductor chip on an upper surface of the second substrate.

7. The semiconductor package of claim 1, further comprising a molding layer at least partially around a side surface of the adhesive layer and the first semiconductor chip between the first substrate and the interposer.

8. The semiconductor package of claim 1, further comprising a second group of at least one solder ball between the first substrate and the first semiconductor chip and configured to electrically connect the first substrate and the first semiconductor chip.

9. The semiconductor package of claim 8, further comprising:
an underfill material at least partially around a side surface of the second group of at least one solder ball between the first substrate and the first semiconductor chip; and
a molding layer at least partially around a side surface of the adhesive layer, a side surface of the underfill material, and the first semiconductor chip between the first substrate and the interposer.

10. A semiconductor package, comprising:
a first package comprising a first substrate and a first semiconductor chip on the first substrate and convex in a direction in which the first substrate is positioned;
a second package on the first package and comprising a second substrate and a second semiconductor chip on the second substrate;
an interposer between the first package and the second package; and
a first group of at least one solder ball on a side surface of the first semiconductor chip and configured to electrically connect the first substrate and the interposer,
wherein a first height from an upper surface of the first substrate to an upper surface of the first semiconductor chip is greater than a second height of the first group of at least one solder ball, the second height being a height of an innermost side of the first group of at least solder ball.

11. The semiconductor package of claim 10, further comprising an adhesive layer between the first semiconductor chip and the interposer, comprising a lower surface having a second width smaller than a first width of the upper surface of the first semiconductor chip, and configured to bond the first semiconductor chip and the interposer.

12. The semiconductor package of claim 11, further comprising a molding layer at least partially around a side surface of the adhesive layer and the first semiconductor chip between the first substrate and the interposer.

13. The semiconductor package of claim 10, further comprising:
an insulating layer between the first semiconductor chip and the interposer and configured to expose at least a portion of the upper surface of the first semiconductor chip; and
a molding layer at least partially around a side surface of the insulating layer and the first semiconductor chip.

14. The semiconductor package of claim 13, wherein the insulating layer comprises a first sub insulating layer and a second sub insulating layer displaced from each other, and
the molding layer is between the first sub insulating layer and the second sub insulating layer.

15. The semiconductor package of claim 10, wherein the interposer is convex in a direction in which the second package is positioned.

16. A semiconductor package, comprising:
a first substrate convex in a direction in which a lower surface is positioned;
a first semiconductor chip on an upper surface of the first substrate and comprising an upper surface having a first width;
an interposer on an upper surface of the first semiconductor chip and having a height from the upper surface of the first substrate becoming smaller as being farther away from a center of the first substrate;
an adhesive layer between the first semiconductor chip and the interposer and comprising a lower surface having a second width smaller than the first width of the upper surface of the first semiconductor chip;
a molding layer at least partially around a side surface of the adhesive layer and the first semiconductor chip between the first substrate and the interposer, and
a group of at least one solder ball on a side surface of the first semiconductor chip and configured to electrically connect the first substrate and the interposer, wherein a first height from the upper surface of the first substrate to the upper surface of the first semiconductor chip is greater than a second height of the group of at least one solder ball, the second height being a height of an innermost side of the group of at least one solder ball.

17. The semiconductor package of claim 16, wherein the interposer is convex in a direction in which an upper surface of the interposer is positioned.

18. The semiconductor package of claim 17, further comprising:
a second substrate parallel with the interposer on the upper surface of the interposer; and
a second semiconductor chip on an upper surface of the second substrate.

19. The semiconductor package of claim 16, wherein a second thickness of the interposer is greater than a first thickness of the first substrate.

* * * * *